(12) United States Patent
Felber et al.

(10) Patent No.: US 6,897,077 B2
(45) Date of Patent: May 24, 2005

(54) TEST STRUCTURE FOR DETERMINING A SHORT CIRCUIT BETWEEN TRENCH CAPACITORS IN A MEMORY CELL ARRAY

(75) Inventors: Andreas Felber, München (DE); Valentin Rosskopf, Pöttmes (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/675,494

(22) Filed: Sep. 30, 2003

(65) Prior Publication Data

US 2004/0061112 A1 Apr. 1, 2004

(30) Foreign Application Priority Data

Sep. 30, 2002 (DE) .......................... 102 45 541
Oct. 17, 2002 (DE) .......................... 102 48 373

(51) Int. Cl.[7] .......................... H01L 21/66; G01R 31/26
(52) U.S. Cl. .......................................................... 438/14
(58) Field of Search ................................ 438/14; 257/48

(56) References Cited

U.S. PATENT DOCUMENTS 6,339,228 B1 * 1/2002 Iyer et al. ..................... 257/48
2002/0063272 A1 5/2002 Miyajima

* cited by examiner

*Primary Examiner*—W. David Coleman
(74) *Attorney, Agent, or Firm*—Laurence A. Greenberg; Werner H. Stemer; Ralph E. Locher

(57) ABSTRACT

A test structure allows determining a short circuit between trench capacitors in a memory cell array in which the trench capacitors are arranged in matrix form. The test structure has, in two rows of trench capacitors, a connection of the trench capacitors of each row by tunnel structures and/or bridge structures. A contact area for contact connection is provided at each end section of a trench capacitor row.

3 Claims, 2 Drawing Sheets

TEST STRUCTURE FOR DETERMINING A SHORT CIRCUIT BETWEEN TRENCH CAPACITORS IN A MEMORY CELL ARRAY

BACKGROUND OF THE INVENTION

Field of the Invention

The invention relates to a test structure for determining a short circuit between trench capacitors in a memory cell array, the trench capacitors being arranged in matrix form.

Semiconductor memories, in particular dynamic random access semiconductor memories (DRAMs), are composed of a matrix of memory cells which are connected up in the form of rows via word lines and columns via bit lines. Data are read from the memory cells or data are written to the memory cells by the activation of suitable word and bit lines. A dynamic memory cell generally contains a selection transistor and a storage capacitor, the selection transistor usually being configured as a horizontally designed field-effect transistor and comprising two diffusion regions separated by a channel above which a control electrode, a so-called gate, is arranged. The gate is in turn connected to a word line. One of the diffusion regions of the selection transistor is connected to a bit line and the other diffusion region is connected to the storage capacitor. Through the application of a suitable voltage to the gate via the word line, the selection transistor turns on and enables a current flow between the diffusion regions in order to charge the storage capacitor via the connected bit line.

One objective in DRAM memory development is to achieve a highest possible yield of memory cells with good functionality in conjunction additionally with a minimum chip size. Ongoing endeavors to miniaturize the DRAM memory cells have led to the design of memory cells in which, in particular, the storage capacitor utilizes the third dimension. A three-dimensional storage capacitor concept is that of trench capacitors comprising a trench that is etched into the semiconductor substrate and filled with a highly conductive material, which serves as an inner capacitor electrode. By contrast, the outer capacitor electrode is generally formed in buried fashion as a diffusion region in the substrate. The outer capacitor electrode is contact-connected via a further layer formed in buried fashion in the semiconductor substrate, a so-called buried plate. The electrical connection between the diffusion region of the selection transistor and the inner capacitor electrode of the trench capacitor in a memory cell is effected in the upper trench region by an electrode connection usually formed as a diffusion region, the so-called buried strap.

In order to keep the chip size as small as possible and at the same time to provide for a sufficient storage capacitance which ensures a sufficiently large read signal, the trench capacitors are being fabricated with increasingly deeper trenches, aspect ratios, i.e. width-to-depth ratios, of up to 1:40 being embodied. Furthermore, the trench capacitors of the memory cells, which fill the substantial part of the memory chip, are being packed evermore densely in order to further reduce the area required by the individual memory cells. DRAM memory chips are usually implemented with the aid of planar technology, the trenches of the trench capacitors preferably being produced with the aid of an anisotropic etching. The demand to make the trenches ever deeper in conjunction at the same time with a reduced distance between the trenches give rise to the risk of a connection between two adjacent trenches being produced on account of a not exactly perpendicular etching operation, which may lead to a short circuit between the adjacent memory cells. To date, such undesirable short circuits between adjacent memory cells have only been able to be ascertained in the context of a fault analysis in the back-end, i.e. after the end of the entire complicated and expensive fabrication process having approximately 500 individual steps.

SUMMARY OF THE INVENTION

It is accordingly an object of the invention to provide a test structure for a memory cell array having trench capacitors arranged in matrix form which overcomes the above-mentioned disadvantages of the heretofore-known devices and methods of this general type and which enables short circuits between trench capacitors to be detected as early as shortly after the fabrication of the trench capacitors in the front-end.

With the foregoing and other objects in view there is provided, in accordance with the invention, a test structure for determining a short circuit between trench capacitors in a memory cell array wherein the trench capacitors are arranged in matrix form, the test structure comprising:

at least one of tunnel structures and bridge structures connecting the trench capacitors of two rows of trench capacitors to one another to form trench capacitor rows; and a contact area for contact connection provided at each end section of each of said trench capacitor rows.

In accordance with an added feature of the invention, said two rows of interconnected trench capacitors are formed within a regular trench capacitor matrix.

In accordance with a concomitant feature of the invention, at least one further row of non-connected trench capacitors is disposed between said two rows of interconnected trench capacitors.

In other words, in a test structure for determining a short circuit between trench capacitors in a memory cell array, in which the trench capacitors are arranged in matrix form, the trench capacitors of two rows of trench capacitors are connected to one another in each case by tunnel and/or bridge structures, a contact area for contact connection being provided at each end section of the trench capacitor row.

The test structure according to the invention makes it possible, in a simple manner, to ascertain short circuits in trench capacitors as early as after the formation and filling of the trench capacitors, that is to say in the front-end region. The test structure can furthermore be realized in a simple manner by means of a functional augmentation of the test structures that are already usually provided in the front-end region, with the aid of a noncritical MUV (mid ultraviolet) mask plane.

In accordance with one preferred embodiment, the test structure with the two rows of trench capacitors that are connected to one another is embodied within a regular trench capacitor matrix. Since the test structure, like the regular memory cell structure, is generally fabricated with the aid of planar technology comprising a sequence of lithography processes, the embedding of the test structure in a regular matrix array ensures that the trench capacitors of the test structure correspond to the regular trench capacitors of the memory cell matrix since the test structure, during the individual lithography steps, has the same surroundings as the regular trench capacitor matrix. The reliability and meaningfulness of the test measurement are significantly improved as a result of this.

In accordance with a further preferred embodiment, a further row of trench capacitors that are not connected to one another is additionally provided between the two rows of trench capacitors of the test structure that are connected to one another. This configuration ensures that not only short circuits which arise on account of the test structure processing but also those short circuits which also result in the context of the regular trench capacitor processing are ascertained.

Other features which are considered as characteristic for the invention are set forth in the appended claims.

Although the invention is illustrated and described herein as embodied in a test structure for determining a short circuit between trench capacitors in a memory cell array, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

The invention is explained herein using the example of a trench capacitor arrangement as used in the context of DRAM memory cells. The formation of the individual structures in the context of memory chip fabrication is preferably effected with the aid of silicon planar technology comprising a sequence of individual processes which each act over the whole area on the surface of a silicon semiconductor wafer, a local alteration of the silicon substrate being carried out in a targeted manner by means of suitable masking steps. In this case, a multiplicity of structures are formed simultaneously in the context of the planar technology. One possible method for producing trench capacitors is explained briefly below in the context of a DRAM memory cell arrangement with reference to FIGS. 1A and 1B.

Figure 1A:
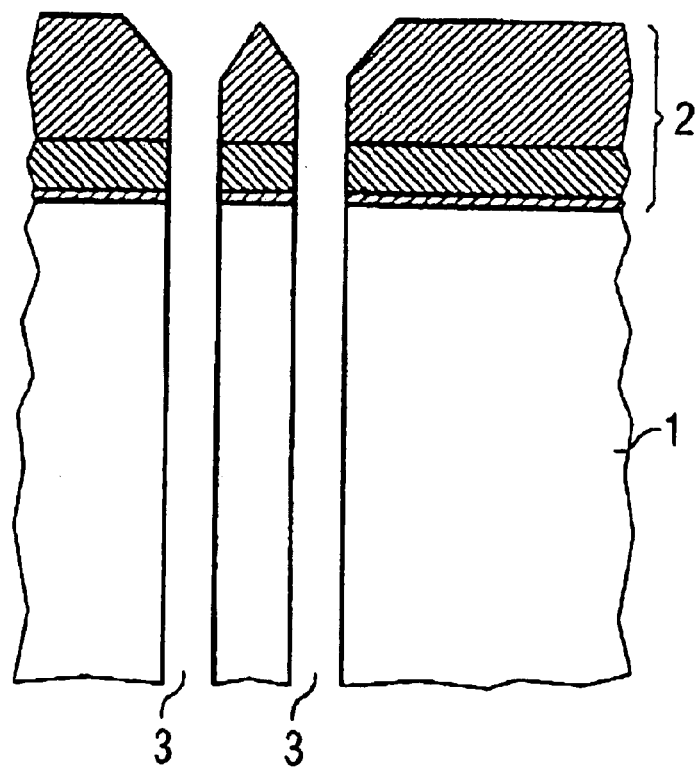
FIG. 1A is a section taken through a semiconductor wafer after a given process step for forming trench capacitors.
Figure 1B:
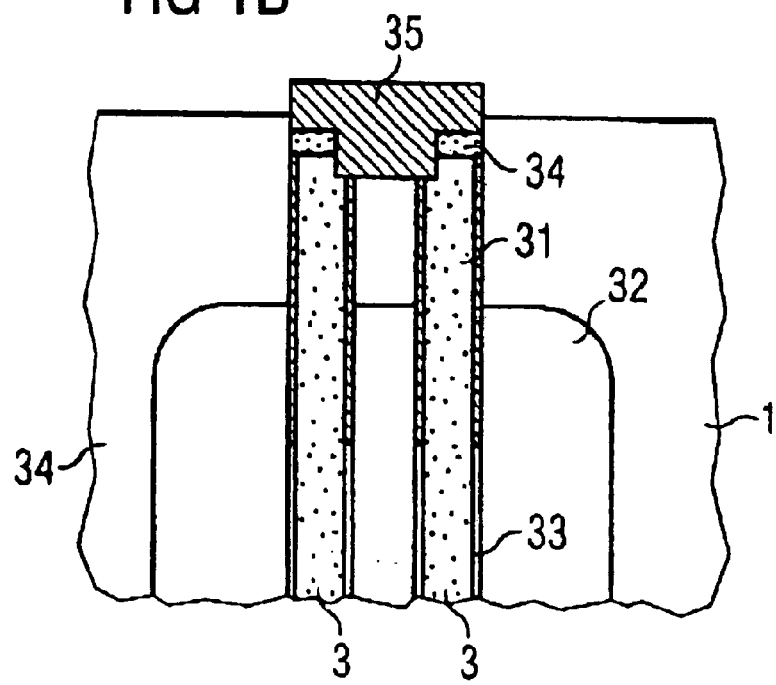
FIG. 1B is a similar section taken through the semiconductor wafer after a further process step.

Referring now to the figures of the drawing in detail and first, particularly, to FIGS. 1A and 1B thereof, a masking layer 2—for example an $SiO_2|Si_3N_4|SiO_2$ layer sequence— is deposited on a silicon wafer 1 from which impurities have been removed. The silicon wafer has generally already undergone various patterning processes (structure not shown). Afterward, the trench capacitor structure is preferably defined with the aid of conventional photolithography technology. For this purpose, a light-sensitive layer is applied to the masking layer 2 and exposed with the aid of a mask having the structure of a design plane of the trench capacitors to be formed. After development, i.e. the removal of the exposed photoresist, the masking layer 2 is etched with the aid of an anisotropic etching in order to produce an etching mask for the trench etching that is subsequently carried out. The trench etching is then carried out after the residual photoresist mask has been eliminated. For this purpose, the silicon is etched anisotropically with the aid of the patterned etching mask down to a depth of approximately 5 μm given a feature size of approximately 0.5 μm.

FIG. 1A shows a cross section through the silicon wafer after the etching of the trenches 3. In this case, as illustrated, preferably at least two trenches are formed in a closely adjacent manner, the selection transistors—preferably formed in planar fashion—of the memory cells then subsequently being arranged laterally in each case in said trenches. As a result of the closely adjacent arrangement of the two trenches, undesired connections can form between the trenches if the etching operation does not proceed completely anisotropically on account of process fluctuations or material defects and, consequently, exactly perpendicular trenches are not produced. Such etching bridges between adjacent trenches may then lead, in the course of the further fabrication process, to short circuits between the inner capacitor electrodes and thus to short circuits between adjacent memory cells.

FIG. 1B shows a cross section through the silicon wafer in a later process stage with trench capacitors that have been completely formed. The trench capacitors are then filled with a highly doped layer, preferably polysilicon which serves as inner capacitor electrode 31. The outer capacitor electrode 32 is formed as a highly doped diffusion region in the lower trench region around the inner capacitor electrode. Said outer capacitor electrode 32 may be produced for example by thermal outdiffusion of a highly doped layer from the trench. The outer capacitor electrode 32 is isolated from the inner capacitor electrode 31 in the trench by a dielectric layer 33.

In the upper trench region, an insulation collar adjoins the dielectric layer 33. Furthermore, in the upper trench region, in each case toward a trench side, provision is made of an electrode connection 34, a so-called buried strap by means of which the inner capacitor electrode 31 can be connected to the subsequently formed planar selection transistor of the memory cell. The region of the trench capacitors is furthermore covered with an insulation layer 35, preferably $SiO_2$.

To date, short circuits between the inner capacitor electrodes 31 of adjacent trench capacitors have only been able to be ascertained in the back-end, i.e. after the conclusion of the entire memory chip fabrication process. The invention makes it possible to determine such short circuits between the inner capacitor electrodes of the trench capacitors as early as in the front-end, that is to say directly after the fabrication of the trench capacitors and before the further processing of the memory chip. This permits defective wafers already to be removed from the wafer process at this early stage and complicated and expensive further process steps thus to be avoided.

Figure 2:
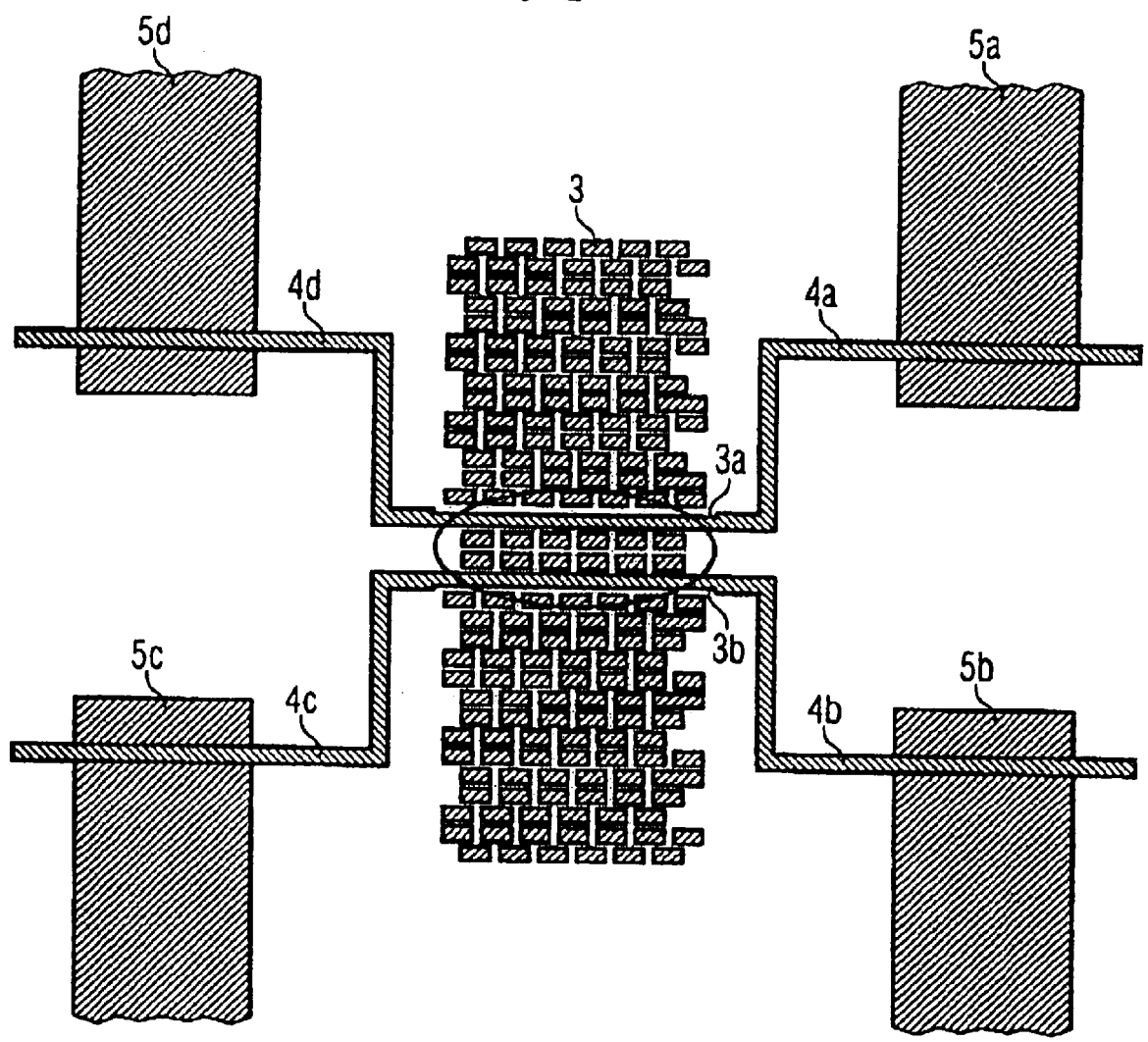
FIG. 2 is a plan view of a test structure according to the invention with a matrix arrangement of trench capacitors.

FIG. 2 shows a possible test structure according to the invention for determining short circuits between trench capacitors in a memory cell array. The test structure is preferably formed in the kerf region, i.e. in the intermediate region between two DRAM chips on a wafer. As is further shown by the plan view in FIG. 2, the test structure according to the invention has a trench capacitor array in a matrix arrangement which corresponds to the regular matrix structure of the trench capacitors in the DRAM memory cell array. In the illustrated embodiment, the trench capacitors 3 are arranged in adjacent rows of trench capacitors each having a rectangular basic area, in which case two adjacent rows of trench capacitors are respectively formed in parallel fashion but the double rows are arranged offset with respect to one another.

As is shown in FIG. 2, in a central region of the trench capacitor array, the trench capacitors of two rows 3a, 3b of trench capacitors are connected to one another in each case by tunnel or bridge structures or a combination of tunnel and bridge structures. The connection of the trench capacitors ensures that the inner capacitor electrodes of the trench capacitors are connected in series. In their end region, the two rows of interconnected trench capacitors 3a, 3b are connected to four large contact areas 5a, 5b, 5c, 5d via four connecting lines 4a, 4b, 4c, 4d, which contact areas can easily be contact-connected via needles of a test needle card.

For testing, a current flow is impressed via such needles on a row of interconnected trench capacitors such as e.g. the trench capacitor row 3a, in order then to ascertain via the further needles whether a current flow also occurs in the other trench capacitor row 3b. Such a current flow indicates a short circuit between the two adjacent rows of trench capacitors. In the embodiment shown, a further double row of trench capacitors that are in each case not connected to one another is provided between the two interconnected rows of trench capacitors 3a, 3b. During the test measurement, it is thus ascertained whether a short circuit takes place across this double row of trench capacitors. The provision of such non-connected trench capacitor rows between the trench capacitor rows 3a and 3b that are connected to one another simplifies the formation of the test structure. In principle, however, the test structure can also be embodied without interposed rows of trench capacitors that are not connected to one another.

We claim:

1. A test structure for determining a short circuit between trench capacitors in a memory cell array wherein the trench capacitors are arranged in matrix form, the test structure comprising:

at least one of tunnel structures and bridge structures connecting the trench capacitors of two rows of trench capacitors to one another to form trench capacitor rows;

a contact area for contact connection provided at each end section of each of said trench capacitor rows; and at least one further row of non-connected trench capacitors disposed between said two rows of interconnected trench capacitors.

2. The test structure according to claim 1, wherein said two rows of interconnected trench capacitors are formed within a regular trench capacitor matrix.

3. The test structure according to claim 1, wherein the test structure is formed in a kerf region of a wafer.

* * * * *